United States Patent
Ngo et al.

(10) Patent No.: US 12,198,890 B2
(45) Date of Patent: Jan. 14, 2025

(54) REPELLER ASSEMBLY FOR MOUNTING INTO AN ARC CHAMBER OF AN ION IMPLANTER AND ARC CHAMBER CONTAINING THE REPELLER ASSEMBLY

(71) Applicant: Plansee USA LLC, Franklin, MA (US)

(72) Inventors: Nam Ngo, Vista, CA (US); Gerhard Duerrhammer, Vista, CA (US); Jacob Boyer, Vista, CA (US); Florian Schaper, Vista, CA (US); Dustin Hacker, Vista, CA (US); Mason Payne, Vista, CA (US); Surf Johnson, Vista, CA (US); Andrew Dalager, Vista, CA (US)

(73) Assignee: Plansee USA LLC, Franklin, MA (US)

( * ) Notice: Subject to any disclaimer, the term of this patent is extended or adjusted under 35 U.S.C. 154(b) by 368 days.

(21) Appl. No.: 17/871,090

(22) Filed: Jul. 22, 2022

(65) Prior Publication Data

US 2024/0029991 A1  Jan. 25, 2024

(51) Int. Cl.
 *H01J 37/08* (2006.01)
 *H01J 1/88* (2006.01)
 *H01J 37/317* (2006.01)

(52) U.S. Cl.
 CPC ............... *H01J 37/08* (2013.01); *H01J 1/88* (2013.01); *H01J 37/3171* (2013.01); *H01J 2237/061* (2013.01)

(58) Field of Classification Search
 CPC .. H01J 37/08; H01J 37/3171; H01J 2237/061; H01J 1/88
 See application file for complete search history.

(56) References Cited

U.S. PATENT DOCUMENTS

| 8,253,334 B2* | 8/2012 | Jerez | H01J 37/08 |
| | | | 313/352 |
| 8,796,649 B2* | 8/2014 | Jerez | H01J 27/08 |
| | | | 250/443.1 |
| 2011/0248179 A1 | 10/2011 | Matesa, Jr. et al. | |
| 2017/0287579 A1* | 10/2017 | Colvin | H01J 27/08 |

FOREIGN PATENT DOCUMENTS

KR  1020050045705 A  5/2005

* cited by examiner

*Primary Examiner* — David E Smith
(74) *Attorney, Agent, or Firm* — Laurence A. Greenberg; Werner H. Stemer; Ralph E. Locher (57) ABSTRACT

A repeller assembly mounts in an arc chamber of an ion implanter. The repeller assembly contains a repeller, a tubular insert, first and second insulators, a contact member, and a lock member. The repeller has a knob-shaped body placed on an inner side of the arc chamber opposite to a cathode assembly. A repeller shaft is arranged extending through an opening of a wall of the arc chamber to an outer side. The repeller shaft has a step narrowing down the repeller shaft. The tubular insert is mounted concentrically to the repeller shaft. The first insulator has a collar shape and is attached to the tubular insert so that an inner shoulder of the first insulator is pressed against an outer side of the wall of the arc chamber. The second insulator is cap-nut shaped and is attached to the first insulator with an outer flange thereof.

18 Claims, 4 Drawing Sheets

REPELLER ASSEMBLY FOR MOUNTING INTO AN ARC CHAMBER OF AN ION IMPLANTER AND ARC CHAMBER CONTAINING THE REPELLER ASSEMBLY

FIELD AND BACKGROUND OF THE INVENTION

The present invention relates to a repeller assembly for mounting into an arc chamber of an ion implanter. More particularly, this invention relates to the different parts of the repeller assembly and their respective designs, their arrangement among themselves and their arrangement in an opening of a wall of an arc chamber. Furthermore, the present invention relates to an arc chamber containing the repeller assembly.

As it is known, in the manufacture of semiconductor components, ion implanters are widely used to modify various regions of a semiconductor wafer by diffusing or implanting positive or negative ions (dopants) into the surface of the wafer to produce regions having varying properties (like e.g., electrical conductivity). These ion implanters include an arc chamber to generate a plasma containing a variety of ion species to be implanted in the surface of the semiconductor wafer.

In one known common configuration of an arc chamber, a repeller (anti-cathode) is located on the opposite side to a cathode assembly. During operation of the arc chamber the cathode assembly is heated, for example, by a filament, and its purpose is to emit electrons by thermionic emission during operation. The electrons are accelerated into the arc chamber by a relatively positive arc voltage on the arc chamber walls, and an externally generated magnetic field causes the electrons to travel a spiral path into the arc chamber. The emitter and repeller electrodes which are typically biased negatively with respect to the walls of the arc chamber confine the emitted electrons. The combined effect of the emitter and repeller electrodes is to concentrate electrons toward the center of the arc chamber to maximize interaction with a dopant gas introduced into the arc chamber via a conduit and thereby attain a plasma having the desired properties.

During operation, the arc chamber contains a host of molecular species at very high temperatures. Components, including the components of a repeller assembly, in this harsh environment are subjected to conditions that may unduly limit their lifetime or their effectiveness, thus limiting the effectiveness and/or increasing the operating costs of the ion implanter. For example, there is a tendency for films of plasma to be deposited on the parts of a repeller assembly, e.g., the repeller shaft, a tubular shield, an insulator etc. This coating of plasma to electrically isolated parts, such as the repeller, can lead to a short circuit in the arc chamber such that a normal operation of the ion implanter is no longer possible. Accordingly, it is desired to have an extended and tortuous coating path such that the coating process (and correspondingly the generation of short-circuits) of electrically isolated parts is prolonged. Further, there are other failure modes such as gas lost of the arc chamber through the opening in the wall of the arc chamber on which the repeller assembly is mounted due to the size of the gaps provided between the repeller assembly and the opening in the wall as well as between the parts of the repeller assembly among themselves. Moreover, due to mechanical or thermal modifications the repeller shaft or the repeller itself can move away from its cantilevered position and directly contact the arc chamber walls or the liners.

From the prior art several repeller assembly configurations are known. In one known configuration, the repeller has a broad portion that faces the center of the arc chamber, and a narrower shaft that extends outside the arc chamber through an opening in the arc chamber end wall. A ceramic insulator is disposed in the arc chamber between the end wall and the repeller to maintain the required electrical isolation.

A modified configuration is described in U.S. Pat. No. 8,796,649. FIG. 4 of this patent shows a repeller assembly, wherein the repeller has an enlarged knob-shaped body at one end within the arc chamber and an integral stem that passes through an opening in an end wall of the arc chamber. The stem design is characterized by a pair of radially outstanding collars thereon. Furthermore, a tubular shield is mounted in the opening of the end wall concentrically of the stem having inter alia at least one radially inwardly directed rib disposed between the collars of the stem. In addition, an insulator ring surrounding the stem is threaded onto the tubular shield and abutted against the end wall. The insulator ring has a disk like end that abuts the outer collar on the stem to closed off a plasma path from the arc chamber through the end wall. Accordingly, a tortuous gap is defined between the stem on the one hand and each of the opening in the end wall of the arc chamber, the tubular shield and the insulator ring. A lock nut is threaded onto an end of the stem and into abutment with the insulator ring to hold the anti-cathode (repeller) in cantilevered relation within the arc chamber.

Almost the same repeller assembly is shown in FIG. 13 of U.S. Pat. No. 8,253,334. In this patent the repeller assembly consists of a repeller, a liner, a tubular shield, an insulator and a lock nut. The stem of the repeller has a pair of spaced apart annular collars each of which is radially spaced from a tubular shield to introduce further impediments to a plasma flow from the arc chamber. In addition, an insulator ring is shown having a disc like end that abuts a collar to close off the plasma path from the arc chamber to the outside.

In the above-mentioned patents, a tortuous gap/plasma path is provided having a limited length. Further, the repeller stem design creates a large gap between the stem and the opening in the end wall of the arc chamber, the tubular shield and the insulator ring.

Therefore, there is still space for improvement in the design of a repeller assembly thereby increasing the lifetime and the effectiveness of a repeller assembly and accordingly, the lifetime and the effectiveness of the arc chamber.

SUMMARY OF THE INVENTION

It is an object of the present invention to provide a repeller assembly which attains longer operating times of an ion implanter. Increasing the operating times has the effect, among others, of lowering the operating costs of an ion implanter as well. Moreover, it is a purpose of the present invention to provide a repeller assembly that achieves a high operation efficiency due to low gas leakage and reduced coating formation.

With the foregoing and other objects in view there is provided, in accordance with the invention, a repeller assembly for mounting in an arc chamber of an ion implanter. The repeller assembly comprising:

a repeller having a knob-shaped body for placing on an inner side of the arc chamber opposite to a cathode assembly of the arc chamber, and a repeller shaft integral with the knob-shaped body and disposed extending through an opening of a wall of the arc chamber to an outer side of the arc chamber, the repeller shaft having at least one step narrowing down the repeller shaft;

a tubular insert mounted concentrically to the repeller shaft;

a first insulator having an inner shoulder and a collar shape and being attached to the tubular insert so that the inner shoulder of the first insulator is pressed against an outer side of the wall of the arc chamber;

a second insulator being cap-nut shaped and having an inner flange and an outer flange, the second insulator being attached to the first insulator via the outer flange thereof;

a contact member being electrically connected to the repeller shaft; and a lock member being fixed on the repeller shaft so that the at least one step of the repeller shaft is pressed against the inner flange of the second insulator.

In other words, the technical object of the present invention is solved by providing a repeller assembly for mounting in an arc chamber of an ion implanter, wherein the repeller assembly comprising a repeller, a tubular insert, at least a first and a second insulator, a contact member, and a lock member. The repeller has a knob-shaped body to be placed on an inner side of the arc chamber opposite to a cathode assembly of the arc chamber and a repeller shaft integral with the body and to be arranged to be extending through an opening of a wall of the arc chamber to an outer side of the arc chamber. The repeller shaft has at least one step narrowing down the repeller shaft and the tubular insert is mounted concentrically to the repeller shaft. The first insulator has a collar shape and is attached to the tubular insert so that an inner shoulder of the first insulator is pressed against an outer side of the wall of the arc chamber. The second insulator is cap-nut shaped and is attached to the first insulator with an outer flange thereof. The contact member is electrically connected to the repeller shaft and the lock member is fixed on the repeller shaft so that the step of the repeller shaft is pressed against an inner flange of the second insulator as outlined in the first independent claim. The repeller assembly is intended for mounting in an arc chamber, while the arc chamber itself does not form part of the invention as claimed in the first independent claim. This claim only describes the respective interactions between the respective parts. Furthermore, an arc chamber of an ion implanter is provided wherein the claimed repeller assembly is installed and has the features of the independent arc chamber claim.

Further features and details of the invention are provided in the subclaims, the description and the drawings. It goes without saying here that features and details that are described in conjunction with the repeller assembly according to the invention also apply in conjunction with the arc chamber according to the invention and vice versa, so that, with respect to the disclosure of the individual aspects of the invention, reference is or can always be made from one another.

The inventors found out that the claimed repeller assembly provides an extended tortuous coating path compared to the prior art. The prior art documents mentioned above describe a tortuous gap between the repeller stem and each of the opening, the tubular shield and the insulator ring. However, this tortuous gap has a limited length depending inter alia upon the position of the last collar on the repeller stem. By using the claimed repeller assembly the gas lost from the arc chamber during ion beam operation is reduced since the gap between the repeller shaft and the opening of an outer wall of the arc chamber, the tubular insert, and the at least first and second insulator is minimized. It is known that the repeller has to be installed to the repeller assembly from the inside of the arc chamber. Therefore, it is evident that in the repeller assembly described in the prior art, the opening in the end wall of the arc chamber must have at least the size of the outstanding collars of the stem. Accordingly, such a repeller stem design creates a large gap between the stem and the opening in the end wall of the arc chamber, the tubular shield and the insulator ring.

Moreover, in the claimed repeller assembly the repeller shaft can be easily introduced into the repeller assembly and the repeller as well as the tubular sheet can be easily replaced. Regarding the prior art mentioned above, the tubular shield has at least one radially inwardly directed rib disposed between the collars of the repeller stem. Accordingly, it is evident that the repeller stem and the tubular shield inter-relate with each other and that the repeller and/or the tubular shield cannot easily be removed from this combination if necessary.

This leads to a longer lifetime of the arc chamber during ion beam operation. Moreover, the claimed repeller assembly reduces the frequency of maintenance shutdowns in the arc chamber.

It is one advantage of the present invention that the design of the repeller shaft (having at least one step) of the claimed repeller assembly is easier to manufacture (compared to a two-collar design), can more easily be replaced and can be easily introduced into the tubular shield and the at least two insulators through an opening of a wall of the arc chamber. It is another advantage of the present invention that parts of the claimed repeller assembly, i.e., at least the repeller, the tubular insert and the at least first and second insulator, are self-aligning. This means that by providing an at least one-step repeller shaft as well as the tubular insert design and the insulator design of the two insulators, the repeller assembly is capable of aligning itself automatically when it is installed through an opening in a wall of an arc chamber. Preferably in the case where the first insulator is screwed on the tubular insert and the second insulator is screwed on the first insulator and the lock member is screwed onto an end of the shaft, no further equipment or measuring device is necessary to correctly position and install the parts of the repeller assembly in an arc chamber of an ion implanter. The correct distance between the repeller assembly and the cathode assembly is also automatically aligned.

The repeller of the claimed repeller assembly has a T-like shape in cross-section with an enlarged knob-shaped body and a shaft integral with the body wherein the shaft is narrowed down in diameter size starting from the knob-shaped body by at least one step to an end of the shaft. If more than one step is provided on the repeller shaft the diameter size of the repeller shaft is narrowed down by each step, i.e., with each additional step provided on the repeller shaft the diameter size of the repeller shaft is getting smaller and smaller. The shaft is arranged on the central axis of the knob-shaped body. The repeller shaft may have exactly one step narrowing down the diameter size of the repeller shaft towards an end of the repeller shaft or may have more than one step narrowing down the diameter size of the repeller shaft to the end of the repeller shaft, e.g., two steps or more steps. The length of the repeller shaft is dependent upon the individual components of the repeller assembly that are aligned along the shaft. It is important that the repeller shaft passes through all the components of the repeller assembly such that the lock member is the final component at the end of the repeller shaft and abuts with the contact member. The repeller shaft is integral with the repeller body means that the repeller body and the repeller shaft could on the one hand be manufactured monolithic from the same material as one piece. Such a manufacturing process is possible by powder-metallurgical production (pressing and sintering a powder into the desired shape) or by melt-metallurgical production (i.e., producing the respective part from a melt). On the other hand, the repeller body and the repeller shaft could be manufactured as two (or more) pieces and then subsequently joined via a material-bonding process by e.g., by soldering, welding, etc. In a preferred embodiment the repeller is manufacture monolithic as one piece. The repeller shaft has a longitudinal main direction of extent. If the repeller is exactly cylindrical with several cylindrical section or steps this main direction of extent corresponds to the cylinder axis direction of the repeller.

The repeller is typically made of tungsten (W) or molybdenum (Mo). Preferably, the repeller is made of tungsten. Preferably the material is as pure as possible, preferably 99.9 wt. %. The at least one-step design of the shaft of the repeller facilitates the manufacturing of such a repeller compared to the two-collar design of a repeller stem used in the prior art. Moreover, the at least one-step design of the shaft narrowing down the shaft diameter results in the advantage that the repeller can be easily introduced and/or replaced from an inside of the arc chamber through an opening in a wall of the arc chamber into an arrangement of a tubular insert and at least two insulators. By providing the claimed repeller assembly, due to the self-aligning design it is possible to position and install the repeller correctly in its predetermined position in an arc chamber user-friendly—without the need of further equipment or measuring devices—thereby avoiding e.g., a possible tilting of the repeller which normally reduces the work capacity.

The tubular insert has the shape of a flanged bushing. When the repeller assembly is mounted into an arc chamber, the tubular insert is placed into an opening of a wall of the arc chamber concentrically of the repeller shaft whereby the flanged side of the tubular insert is directed towards an inner side of the arc chamber and has a larger diameter than the opening to abut the wall of the arc chamber. Preferably the flanged side of the tubular insert and the opening in the wall of the arc chamber are chamfered such that the flange abuts against the opening in the wall of the arc chamber. Opposite to the flanged side the bushing of the tubular insert is connected to the first insulator so that an inner shoulder of the first insulator is pressed against an outer side of the wall of the arc chamber. The tubular insert has an inner diameter that is larger at the flanged side than at the bushing. In an repeller assembly wherein a two-step repeller shaft is used, a first step of the two-step repeller shaft may lie within the flanged side of the tubular insert. The tubular insert is made of preferably made of tungsten or molybdenum. In a different embodiment the tubular insert is made of an electrically insulting material, e.g., high temperature ceramic material such as $Al_2O_3$ such that the tubular insert can serve as an insulator. The tubular insert provides a means for holding the first insulator and guiding the repeller shaft towards the second insulator.

The first insulator has a collar shape containing in radial direction (from the inside to the outside and perpendicular to the repeller shaft) an inwardly directed shoulder (inner shoulder) and an outwardly directed shoulder (outer shoulder). The inwardly directed shoulder is turned towards the repeller shaft and the outwardly directed shoulder is located opposite to the inwardly directed shoulder. The first insulator is attached to the tubular insert so that the inwardly directed shoulder is pressed against an outer side of the wall of the arc chamber when the claimed repeller assembly is mounted into an arc chamber. The first repeller may have a circumferential recess that faces the inner and outer shoulder of the first repeller (in longitudinal main direction of the assembly). This recess prolongs the coating path/plasma path of the repeller assembly. In a preferred embodiment the first insulator and the tubular insert are attached to each other by a threaded connection, for example by screwing, such that both parts are in close connection and the inner shoulder of the first insulator is pressed against an outer side of the wall of the arc chamber.

The second insulator has a cap-nut like structure containing in a radial direction (from the inside to the outside and perpendicular to the repeller shaft) an inner flange and an outer flange. The outer flange of the second insulator is attached to the outer shoulder of the first insulator and the inner flange of the second insulator is pressed against one step of the repeller shaft. Accordingly, the second insulator and one step of the repeller shaft (or the second insulator and the step in a one-step repeller shaft) close off a plasma path starting from the arc chamber. If a repeller shaft is used having two steps, then preferably the last step towards the end of the repeller shaft close off the plasma path starting from the arc chamber. In a preferred embodiment the first insulator and the second insulator are attached to each other by a threaded connection, for example by screwing.

The first and second insulator are arranged in the repeller assembly following one another in a longitudinal main direction (x-direction/axial direction) along the repeller shaft. The radial direction (y- and z-direction) is perpendicular to the longitudinal main direction.

The first and second insulator are made of high temperature ceramic material, preferably $Al_2O_3$, and electrically isolate the repeller from the arc chamber.

The contact member is electrically connected to the repeller shaft and connects with a bias to the cathode support. Preferably the contact member is a cathode strap made out of molybdenum (Mo), tungsten (W) or silver (Ag). The contact member is placed between the second insulator and the lock member.

The lock member is fixed onto an end of the repeller shaft such that the step of a one-step repeller shaft is pressed against the inner flange of the second insulator. If a two-step design of the repeller shaft is used, preferably the last step at the end of the repeller shaft is pressed against the inner flange of the second insulator. Accordingly, the repeller is hold within the arc chamber in a cantilevered arrangement. The lock member can be made out of molybdenum, tungsten or stainless steel. In a preferred embodiment the lock member is a lock nut.

In a preferred embodiment the repeller assembly further contains a cup-shaped shield. The cup-shaped shield is inserted between the second insulator and the contact member and covers at least the first and second insulator. Preferably an outer side of the wall of the arc chamber has a circumferential recess around the opening and the cup-shaped shield reaches into this recess. The cup-shaped shield could be made out of different materials such as graphite or metallic material. Preferably, the cup-shaped shield is made of a metallic material like aluminum, stainless steel, molybdenum or tungsten. In an alternative embodiment the cup-shaped shield is made of an electrically insulating material, preferably a ceramic such as $Al_2O_3$ such that the cup-shaped shield can serve as an insulator. If the cup-shaped shield is made of a metallic material, it can be easily cleaned from deposited plasma and possibly reused in a repeller assembly such that a cost saving is achieved.

In a preferred embodiment, the repeller assembly consist of the repeller, the tubular insert, the first and second insulator, the contact member and the lock member.

In a further preferred embodiment, the repeller assembly consists of the repeller, the tubular insert, the first and second insulator, the cup shaped shield, the contact member, and the lock member.

In a preferred embodiment of the present invention at least some parts of the repeller assembly, in particular, the repeller, the tubular insert and the at least first and second insulator are geometrically configured in such a way that when these parts are assembled together along a longitudinal main direction of extent (x-direction/axial direction) of the repeller shaft these parts are self-aligning. If the repeller is for example exactly cylindrical with several cylindrical sections, the longitudinal main direction of extent corresponds to the cylinder axis direction. So, these parts are positioned with respect to the axial direction in the correct distance to each other and with respect to the radial direction (which is perpendicular to the axial direction) also correctly and firmly positioned to each other. As already mentioned, these parts have a corresponding geometrically configured shape so that these self-aligning features are realized (this will also be described in further detail with regards to the figures). In a preferred embodiment this is inter alia also achieved by the inclined wall of the opening and the corresponding inclined wall of the flange of the tubular insert. Accordingly, the correct placement of these parts among themselves and when mounted into an arc chamber of an ion implanter is ensured. Moreover, due to the self-aligning properties no additional equipment or measuring devices are necessary to correctly arrange the parts of the repeller assembly.

The present invention also relates to an arc chamber of an ion implanter comprising the claimed repeller assembly. The repeller assembly is placed in an opening of a wall of the arc chamber opposite to a cathode assembly of the arc chamber. The wall of the arc chamber having the opening could be for example the rear wall of the arc chamber.

By using the claimed repeller assembly an inner gap is defined between the arc chamber and the repeller assembly wherein this inner gap extends along the body of the repeller, then along the shaft of the repeller and then between the first and the second insulator where it ends. The inner gap is formed along the body of the repeller whereby it is limited on the opposing side by adjacent parts of the body of the repeller, e.g., the wall of the arc chamber, the end liner and/or the tubular insert. Then the inner gap extends along the shaft of the repeller wherein it is limited on the opposing side by adjacent parts, e.g., the tubular insert, and e.g., the first insulator. In the further course the inner gap is limited by the arrangement of the at least first and second insulator and the circumferential recess at one side of the first insulator.

This inner gap is very small compared to the gap known from the prior art when using a repeller stem having a pair of radially outstanding collars. In the prior art the width of a gap between a repeller stem and each of an opening, tubular shield and insulator ring is dependent on the size of the radially outstanding collars of the repeller stem because the repeller has to be introduced into the opening in an end wall of the arc chamber from the inside of the arc chamber. The size of the inner gap according to the present invention is ≤2 mm, preferably 0.4 to 1.5 mm, more preferably 0.5 to 1.0 mm. Accordingly, by using the claimed repeller assembly the size of the gap can be minimized resulting in a reduced gas lost in the arc chamber during ion beam operation.

Moreover, the inner gap generates an extended tortuous path which contains due to the specific design of the different parts of the repeller assembly—when viewing in the direction from an inner side of the arc chamber, through the opening of the wall to an outer side of the arc chamber—at least five turns and at least one side branch. The side branch preferably extends between the at least two insulators, more preferably extend within the first insulator. Also, the side branch has preferably a width of ≤2 mm, preferably 0.4 to 1.5 mm, more preferably 0.5 to 1.0 mm. Accordingly, the plasma path is prolonged when compared to with the paths disclosed in the prior art because at least two insulators are used. If a two-step design of the repeller shaft is used the inner gap generates an extended tortuous path having at least seven turns and at least one side branch. During ion beam operation of the arc chamber such an extended tortuous path delays the buildup of a conductive plasma layer on the surface of the parts of the repeller assembly. Thereby the lifetime of a repeller assembly during ion beam operation is increased.

Furthermore, the claimed arc chamber including the repeller assembly defines an outer gap extending between an outer side of the arc chamber and the first insulator and then into the first insulator where it ends. In this case the outer gap generates a path having one turn. The width of the outer gap is ≤2 mm, preferably 0.4 to 1.5 mm, more preferably 0.5 to 1.0 mm. None of the cited prior art documents discloses or suggests an outer gap.

In a preferred embodiment of the present invention the outer side of the wall of the arc chamber shows a circumferential recess and a cup-shaped shield is inserted between the second insulator and the contact member covering at least the first and second insulator and reaching at least partially into the recess of the outer side of the arc chamber. In this case the outer gap furthermore extends between the outer side of the arc chamber and the cup-shaped shield such that the outer gap generates an extended tortuous path comprising at least three turns—when viewing in the direction from the outside of the cup-shaped shield along the outer side of the arc chamber, then between the outer side of the arc chamber and the first insulator and then into the first insulator where it ends. In this embodiment it is evident that at least two turns are achieved due to the fact that the outer side of the wall of the arc chamber shows a circumferential recess and the cup-shaped shield at least partially reaches into this recess. By providing the cup-shaped shield, the outer gap comprises in addition a side branch extending between the first insulator and the cup-shaped shield and then between the second insulator and the cup-shaped shield where it ends. Therefore, in this preferred embodiment where the cup-shaped shield is inserted between the second insulator and the contact member and covers at least the first and second insulator and at least partially reaches into the recess provided on the outer side of the wall of the arc chamber, the outer gap generates a tortuous path having at least three turns and at least one side branch.

As already outlined above the parts of the repeller assembly are self-aligning along a longitudinal main direction of extent of the repeller shaft, when arranging the repeller and the tubular insert on an inner side of the arc chamber and the at least first and second insulator on an outer side of the arc chamber and when assembling them together through the opening in the wall of the arc chamber. As already outlined above the longitudinal main direction of extent of the repeller shaft corresponds to the cylindrical axis direction of the repeller. So, these parts are positioned with respect to the axial direction in the correct distance to each other and with respect to the radial direction (which is perpendicular to the axial direction) also correctly and firmly positioned to each other. As already mentioned above, also the distance between the repeller assembly and the cathode assembly is automatically and correctly aligned. This is advantageous because the repeller assembly shows superior performance and longer service life than poorly/wrong aligned assemblies. Misalignment of a repeller assembly affects short circuits and/or the arc chamber does not run correctly.

Other features which are considered as characteristic for the invention are set forth in the appended claims.

Although the invention is illustrated and described herein as embodied in a repeller assembly for mounting into an arc chamber of an ion implanter and arc chamber comprising the repeller assembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
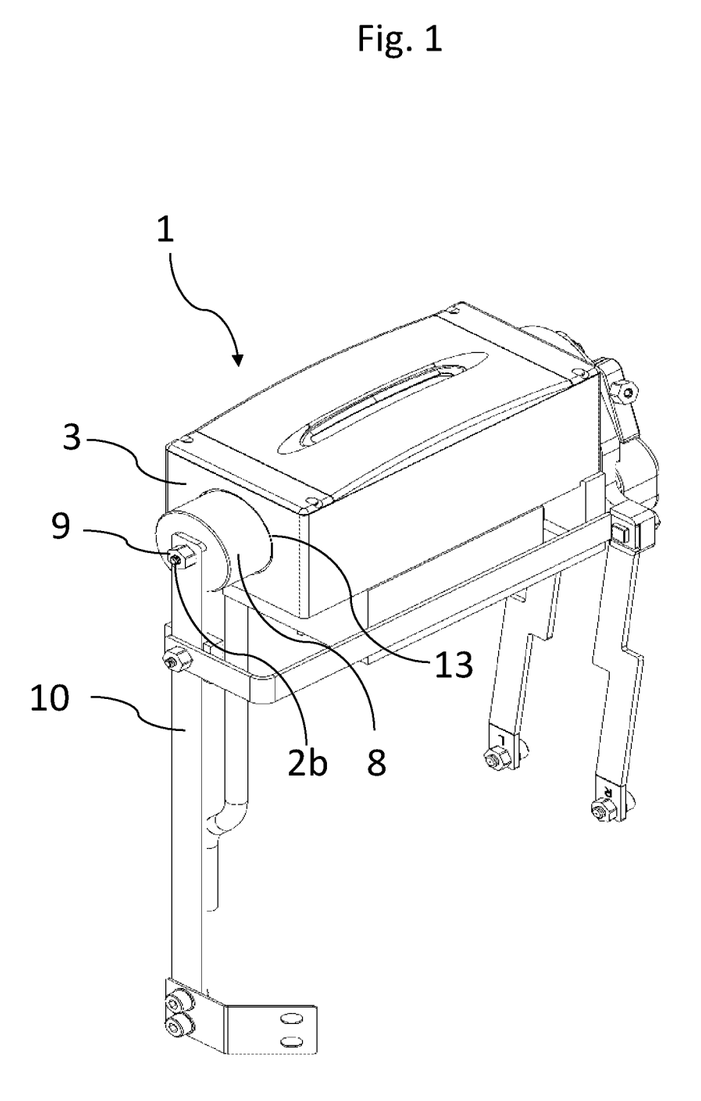
FIG. 1 is a perspective view of an arc chamber for an ion implanter in accordance with a preferred embodiment of the invention.

Referring now to the figures of the drawings in detail and first, particularly to FIG. 1 thereof, there is shown an exterior view of an arc chamber 1 of an ion implanter is shown. The arc chamber 1 is of elongated box-like structure having a bottom, four side walls and a top wall provided with a liner on the underside (not visible in this FIG.). In FIG. 1, the arc chamber 1 has one outer wall, i.e., a rear wall 3, at one end of the arc chamber with an opening 13 for mounting the repeller assembly. FIG. 1 shows the arc chamber 1 including a repeller assembly according to a preferred embodiment of the present invention. On the opposite side of the repeller assembly a cathode assembly is located (in a front wall of the arc chamber). In FIG. 1 an embodiment is shown wherein a repeller, a tubular insert, and at least a first and second insulator of the claimed repeller assembly are covered by a cup-shaped shield 8 (and, therefore, not visible in FIG. 1). The cup-shaped shield 8 is fixed to a contact member 10, e.g., a cathode strap, by a lock member 9, e.g., a lock nut. From FIG. 1, it is evident that the cup-shaped shield 8 as well as the contact member 10 has a hole, e.g., a borehole, in the region where the repeller shaft passes through these parts. Further, the end of the repeller shaft 2b is visible in this figure because the lock member 9 is threaded onto the end of the repeller shaft.

Figure 2:
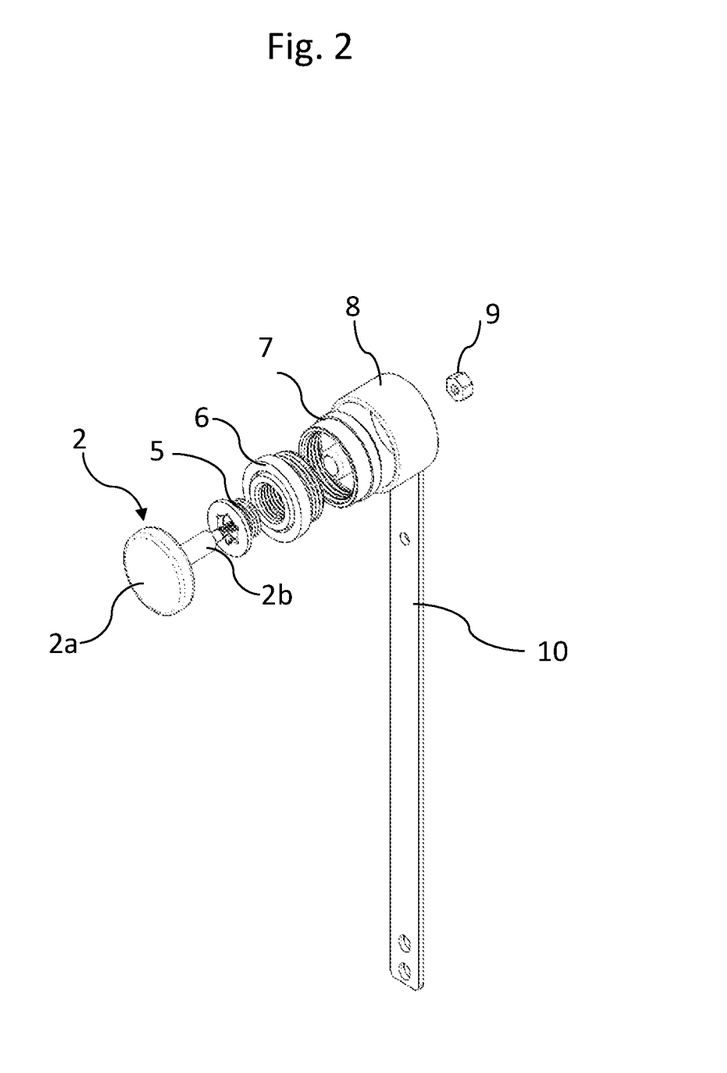
FIG. 2 is an exploded perspective view of a repeller assembly in accordance with a preferred embodiment of the invention.

FIG. 2 illustrates the parts of a preferred embodiment of the claimed repeller assembly. FIG. 2 shows the repeller 2 having a knob-shaped body 2a and a repeller shaft 2b, a tubular insert 5, the first insulator 6, the second insulator 7, the cup-shaped shield 8, the contact member 10, e.g. a cathode strap, and the lock member 9, e.g. a lock nut. When the repeller assembly is assembled together, the repeller shaft 2b passes through all parts, i.e., the tubular insert, the first and second insulator, the cup-shaped shield and the contact member (both having a hole in this region—see also FIG. 1) and is fixed at the end with the lock member 9, in this case a lock nut. It is evident from FIG. 2 that in this embodiment the tubular insert 5 and the first insulator 6 are attached to each other by a threaded connection. The same applies for the first insulator 6 and the second insulator 7. The cap-shaped shield 8 is put on the joined first and second insulator such that it covers (towards the outside) the first and second insulator completely. Moreover, by the specific design of the repeller shaft 2b, the tubular insert 5, the first (i.e., collar shaped) insulator 6 and the second (i.e., cap-nut shaped) insulator 7 the repeller 2 can be easily introduced into the assembly and the repeller shaft 2b is inserted into the concentric hole (i.e., the inner flange of the second insulator) provided in the middle of the second insulator 7 before it is fixed. All parts of the repeller assembly are assembled together along a longitudinal main direction of extent of the repeller shaft, i.e., along the central axis of the repeller shaft. FIG. 2 shows that the repeller, the tubular insert, and the first and second insulator are self-aligning along the longitudinal main direction of extent of the repeller shaft. Accordingly, the correct placement of the parts of the repeller assembly among themselves and when mounted into an opening of a wall of the arc chamber of an ion implanter is ensured. If a threaded connection between the tubular insert and the first insulator as well as between the first insulator an the second insulator is used, the first and second insulator can be assembled together first and then mounted on the tubular insert as one piece. Moreover, by using threaded connections between these parts, the repeller assembly is self-aligning, i.e., no additional tooling is necessary for the exact positioning of the repeller assembly. Further, it is evident from FIG. 2 that all parts of the repeller assembly are reversibly arranged such that it is possible to exchange single parts, e.g., the repeller, of the repeller assembly.

Figure 3A:
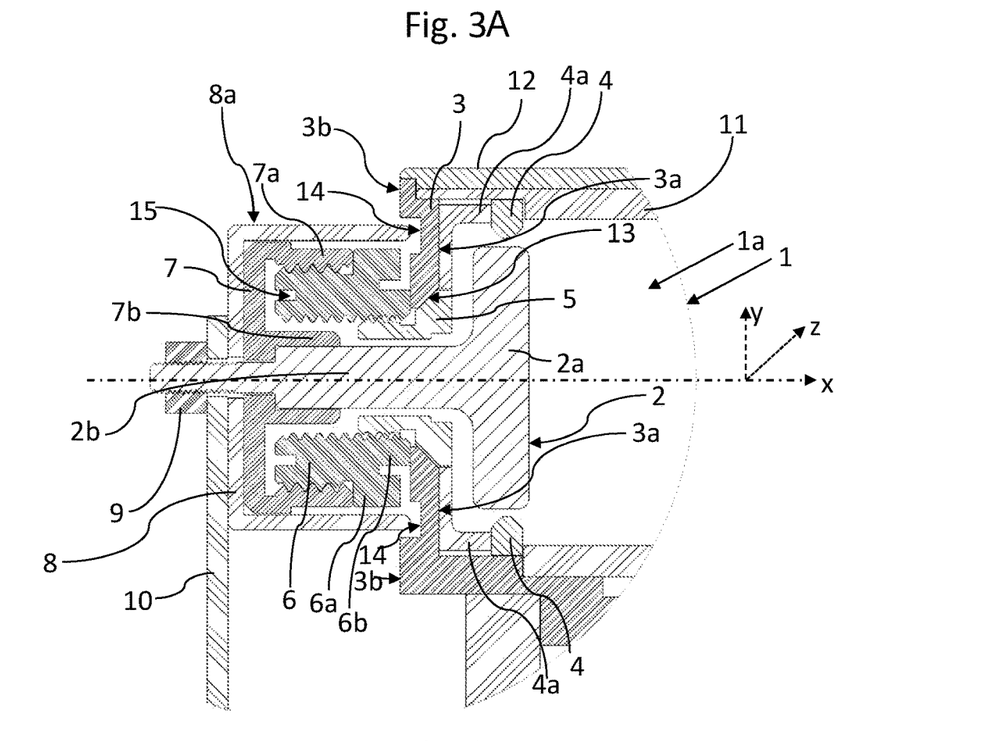
FIG. 3A and FIG. 3B are sectional views of the repeller assembly mounted into the arc chamber of FIG. 1 according to a preferred embodiment of the invention and both figures are rotationally symmetric regarding the repeller assembly.

Referring to FIG. 3A an embodiment of the claimed repeller assembly in sectional view is shown. FIG. 3A shows an arc chamber 1 provided with the claimed repeller assembly and the cup-shaped shield 8. The repeller assembly is mounted into the arc chamber 1 through an opening 13 in a wall at one end of the arc chamber 1, i.e., in a rear wall 3 of the arc chamber. The repeller assembly is located opposite to a cathode assembly at the other end (i.e., a front wall) of the arc chamber (not shown). The repeller assembly consists of the repeller 2, the tubular insert 5, the first insulator 6, the second insulator 7, the contact member 10 and the lock member 9. In addition, FIG. 3A shows the cup-shaped shield 8 which is arranged between the second insulator 7 and the connecting member 10 and covers the first and second insulator. Since FIG. 3A is rotationally symmetric with regard to the repeller assembly the reference signs describing the parts of the repeller assembly are only given once. That does not apply for the components of the arc chamber (e.g., the upper wall, the liner or the end liner). As already outlined above, the rear wall 3 has an opening 13. The repeller 2 and the tubular insert 5 have to be inserted into the repeller assembly from an inner side 1*a* of the arc chamber. The first and second insulator, the contact member 10, the lock member 9 and the cup-shaped shield 8 are arranged on an outer side of the arc chamber. The rear wall 3 shows on an outer side 3*b* a circumferential recess 14 around the opening 13 of the rear wall 3. FIG. 3A also shows a top wall 12 of the arc chamber and inside the arc chamber a liner 11 on the underside of the top wall and an end liner 4. The repeller 2 has an enlarged knob-shaped body 2*a* within the arc chamber and an integral shaft 2*b* that passes though said opening 13 in the rear wall 3 to the outside of the arc chamber. The repeller shaft 2*b* is integrally arranged in the center of the knob-shaped body having a certain initial diameter. The repeller shaft 2*b* has one step narrowing down the initial diameter of the shaft which is present at the beginning of the shaft (starting from the knob-shaped body) to the end of the shaft, i.e., the diameter of the repeller shaft is smaller after the step. The end liner 4 is mounted with the assistance of a spacer ring 4*a* between an inner side 3*a* of the rear wall 3 of the arc chamber and the knob-shaped structure 2*a* to prevent flakes during operation that may otherwise cause a short circuit. Moreover, the inner gap is prolonged by this arrangement thereby further extending the coating path. Concentrically around the repeller shaft a tubular insert 5 is mounted in the opening of the rear wall. The tubular insert 5 is a flanged bushing which has at one end a flange which is directed towards the inner side 1*a* of the arc chamber 1 and on the other side a bushing with a uniform diameter. Since the opening in the rear wall 3 is sloping in axial direction from the inner side 3*a* to the outer side 3*b* of the rear wall 3 the flange of the tubular insert is inclining in axial direction and is of larger diameter than the bushing. Accordingly, the tubular insert abuts the rear wall 3 of the arc chamber 1. The bushing of the tubular insert provides a means for holding the first insulator 6. The first insulator 6 has a collar shape containing in radial direction an inner shoulder 6*b* and an outer shoulder 6*a*. The first insulator is attached to the tubular insert 5 in such a way that an inner shoulder 6*b* of the first insulator is pressed against the rear wall 3 of the arc chamber. Accordingly, the first insulator abuts against the rear wall of the arc chamber. In addition, the first insulator has a circumferential recess 15 at one end of the first insulator opposite to the outer shoulder and inner shoulder. The second insulator 7 is mounted to the first insulator and has a cap-nut like structure. As illustrated in FIG. 3A an outer flange 7*a* of the second insulator is attached to the first insulator. Further, an inner flange 7*b* of the second insulator abuts the step of the repeller shaft. As already outlined above the cup-shaped shield 8 covers the first and second insulator and reaches into the recess 14 provided on the outer side of the rear wall 3*b*. The contact member 10 is electrically connected to the end of the repeller shaft and is arranged to be mounted with a fixing member 9 to the cup-shaped shield and the repeller assembly. According, the inner flange 7*b* of the second insulator is pressed against the step of the repeller shaft 2*b* and the flange 7*a* of the second insulator is pressed against to the outer shoulder 6*a* of the first insulator.

Since the repeller has to be mounted through the opening 13 in the rear wall 3 from the inner side 1*a* of the arc chamber 1 into the other parts of the assembly, it is evident that the design of the repeller shaft is suitable to easily introduce or replace the repeller. FIG. 3A shows an embodiment wherein the bushing of the tubular insert 5 is screwed onto the first insulator 6. The first insulator 6 is also screwed onto the second insulator 7 and the lock member 9 is screwed onto an end of the repeller shaft 2*b*. In this preferred embodiment, the parts of the repeller assembly are self-aligning when assembling the parts together along a longitudinal main direction of extent of the repeller shaft 2*b*. The longitudinal main direction of extent is shown in FIG. 3A as the x-axis (axial direction). The parts of the repeller assembly have a geometrical shape that makes it possible that the parts are self-aligning correctly in fixed positions in x-direction, y-direction and z-direction. Accordingly, the claimed repeller assembly can be easily mounted into the arc chamber without additional equipment or measuring devices that are normally necessary to correctly arrange the parts of the repeller assembly into an opening in the wall of the arc chamber.

Figure 3B:
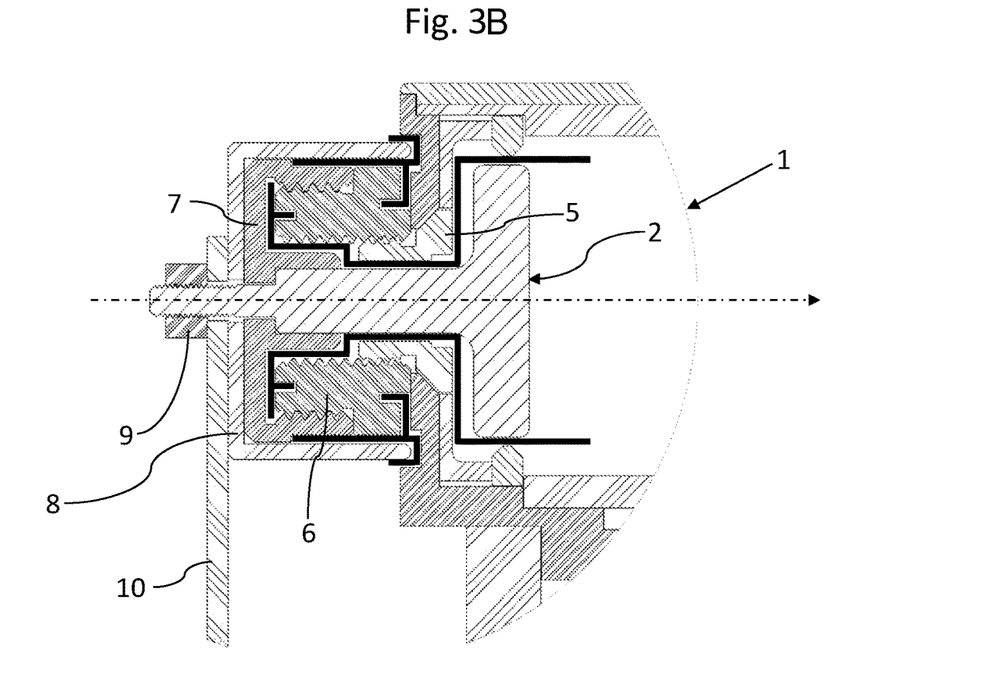

FIG. 3B shows the same repeller assembly mounted into an arc chamber as FIG. 3A but particularly highlight an inner gap and an outer gap that are defined if the repeller assembly is inserted into an arc chamber. The inner gap extends along the body of the repeller (where it is limited on the other side by the end liner and the tubular insert), then extends along the shaft of the repeller (where it is limited on the other side by the tubular insert and the first insulator) and then extends between the first and second insulator where it ends. In this embodiment the first insulator has a circumferential recess acting as a side branch regarding the inner gap. The black lines mark the flow of plasma/gas from the inner side/inside of the arc chamber to the outer side/outside. It is shown that the gas flows along the repeller, through the opening in the rear wall of the arc chamber and then along the tubular insert, the first insulator and the second insulator. By the provision of a tubular insert and the specific design of the two insulators it is possible to provide an extended tortuous inner gap for the plasma flow of five turns and one side branch (viewing in the direction from the inside of the arc chamber). Accordingly, the time until the whole gap is coated with plasma is prolonged leading to a longer lifetime extension of the arc chamber. In addition, FIG. 3B shows an outer gap. Without the cup-shaped shield, the outer gap extends between outer side of the rear wall 3*b* of the arc chamber and the first insulator where it ends. However, FIG. 3B shows a preferred embodiment of the repeller assembly having a cup-shaped shield. Accordingly, the outer gap furthermore extends on the outside of the cup-shaped shield 8*a* between the cup-shaped shield and the rear wall of the arc chamber and then between the second insulator and the cup shaped shield where it ends. Since the outer side of the rear wall of the arc chamber provides a circumferential recess and the cup-shaped shield at least partially extends into this recess the outer gap provides two additional turns when compared to an embodiment where no recess in the rear wall is provided. In FIG. 3B an extended tortuous outer gap for the plasma flow is provided having four turns and a side branch. The figure also shows that the inner gap as well as the outer gap show along its entire length a width of the gap which is ≤2 mm.

Figure 4A:
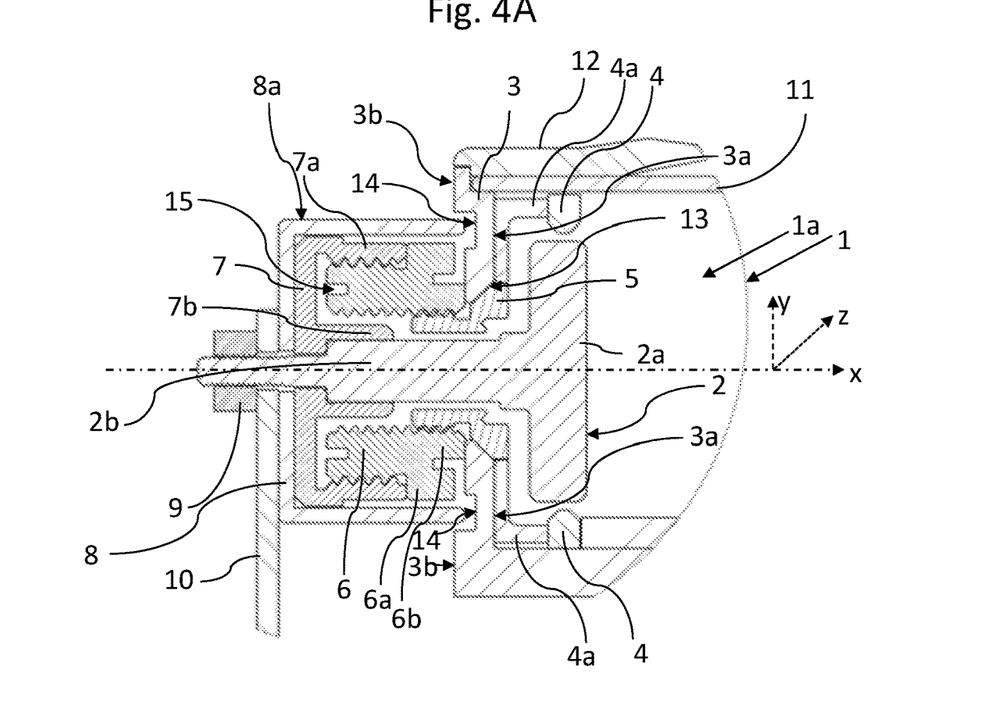
FIG. 4A and FIG. 4B are sectional views of the repeller assembly mounted into the arc chamber of FIG. 1 according to a further preferred embodiment of the invention and both Figures are rotationally symmetric regarding the repeller assembly.

FIG. 4A shows another embodiment of the claimed repeller assembly in sectional view which largely corresponds to the repeller assembly shown in FIG. 3A. However, the repeller contains a repeller shaft having two steps. Therefore, we refer to the description of FIG. 3A and will only highlight the differences regarding the arrangement of this repeller assembly compared to the repeller assembly shown in FIG. 3A. Regarding this repeller assembly the repeller shaft 2b has two steps narrowing down the initial diameter of the shaft from the beginning of the shaft (starting from the knob-shaped body) to the end of the shaft, i.e., with each step the diameter of the repeller shaft is reduced. In this embodiment the second step at the end of the repeller shaft is pressed against the inner flange 7b of the second insulator and first step of the repeller shaft (which is located close to the knob-shaped body) is situated within the flange of the tubular insert 5 when the whole arrangement is fixed on the repeller shaft.

Figure 4B:
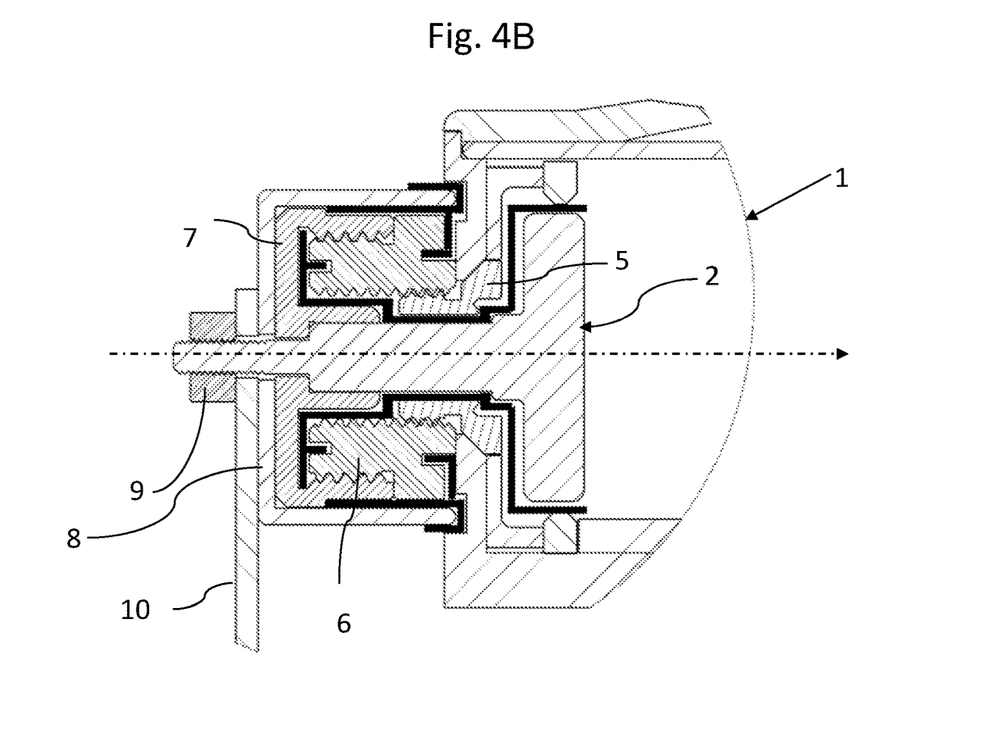

FIG. 4B shows the same repeller assembly mounted into an arc chamber as FIG. 4A but particularly highlight an inner gap and an outer gap that are defined if the repeller assembly is inserted into an arc chamber. FIG. 3B already describes the course of the inner gap and the outer gap. The description given in FIG. 3B also applies to FIG. 4B. The black lines mark the flow of plasma/gas from the inner side/inside of the arc chamber to the outer side/outside. By the provision of a tubular insert and two insulators as well as providing a two-step design of the shaft, it is possible to provide an extended tortuous inner gap for the plasma flow of seven turns and one side branch (viewing in the direction from the inside of the arc chamber). The figure also shows that the inner gap as well as the outer gap show along its entire length a width of the gap which is ≤2 mm.

The claimed invention thus provides a repeller assembly that when mounted into an arc chamber of an ion implanter improves the life performance of the ion implanter during ion beam operation. Accordingly, the claimed invention reduces the frequency of maintenance shutdowns in the arc chamber.

Due to the self-aligning design of the parts a correct installation of the repeller assembly is possible without using further equipment or measuring devices.

Further, single parts of the repeller assembly are easier to manufacture (such as the repeller) and/or can be easily replaced.

The following is a summary list of reference numerals and the corresponding structure used in the above description of the invention:

1—arc chamber
1a—inner side of the arc chamber
2—repeller
2a—knob-shaped body of the repeller
2b—integral repeller shaft
3—rear wall of the arc chamber
3a—inner side of the rear wall
3b—outer side of the rear wall
4—end liner
4a—spacer ring
5—tubular insert
6—first insulator
6a—inner shoulder of first insulator
6b—outer shoulder of first insulator
7—second insulator
7a—outer flange of second insulator
7b—inner flange of second insulator
8—cup-shaped shield
8a—outer side of cup-shaped shield
9—lock member, preferably a lock nut
10—contact member, preferably a strap
11—liner
12—top wall of arc chamber
13—opening in the rear wall of the arc chamber
14—recess on the outer side of the rear wall
15—recess of the first insulator

The invention claimed is:

1. A repeller assembly for mounting in an arc chamber of an ion implanter, the repeller assembly comprising:
    a repeller having a knob-shaped body for placing on an inner side of the arc chamber opposite to a cathode assembly of the arc chamber, and a repeller shaft integral with said knob-shaped body and disposed extending through an opening of a wall of the arc chamber to an outer side of the arc chamber, said repeller shaft having at least one step narrowing down said repeller shaft;
    a tubular insert mounted concentrically to said repeller shaft;
    a first insulator having an inner shoulder and a collar shape and being attached to said tubular insert so that said inner shoulder of said first insulator is pressed against an outer side of the wall of the arc chamber;
    a second insulator being cap-nut shaped and having an inner flange and an outer flange, said second insulator attached to said first insulator via said outer flange thereof;
    a contact member being electrically connected to said repeller shaft; and
    a lock member being fixed on said repeller shaft so that said at least one step of said repeller shaft is pressed against said inner flange of said second insulator.

2. The repeller assembly according to claim 1, wherein said contact member is placed between said second insulator and said lock member.

3. The repeller assembly according to claim 1, further comprising a cup-shaped shield, wherein said cup-shaped shield is inserted between said second insulator and said contact member and covers at least said first and second insulators.

4. The repeller assembly according to claim 1, wherein said contact member is a cathode strap.

5. The repeller assembly according to claim 1, wherein said lock member is a lock nut.

6. The repeller assembly according to claim 1, wherein said repeller, said tubular insert, and said first and second insulators of the repeller assembly are geometrically configured such that these parts are self-aligning along a longitudinal main direction of extent of said repeller shaft when assembling them together.

7. The repeller assembly according to claim 1, wherein said first insulator and said tubular insert are attached to each other by a threaded connection.

8. The repeller assembly according to claim 1, wherein said first insulator and said second insulator are attached to each other by a threaded connection.

9. The repeller assembly according to claim 1, wherein said repeller shaft has exactly one said at least one step narrowing down said repeller shaft towards an end of said repeller shaft.

10. The repeller assembly according to claim 1, wherein said at least one step narrowing down said repeller shaft is one of at least two steps narrowing down said repeller shaft towards an end of said repeller shaft.

11. The repeller assembly according to claim 1, wherein said tubular insert is made of an electrically insulating material.

12. The repeller assembly according to claim 3, wherein said cup-shaped shield is made of an electrically insulating material.

13. An arc chamber of an ion implanter, the arc chamber comprising:
- a cathode assembly;
- a wall having an opening formed therein; and
- said repeller assembly according to claim 1, wherein said repeller assembly is placed in said opening of said wall of the arc chamber opposite to said cathode assembly of the arc chamber such that an inner gap is defined extending along said knob-shaped body of said repeller, then along said shaft of said repeller, then between said first and second insulators where it ends, wherein a width of said inner gap is ≤2 mm.

14. The arc chamber according to claim 13, wherein said inner gap generates a tortuous path containing at least five turns and at least one side branch.

15. The arc chamber according to claim 13, wherein said repeller, said tubular insert, and said first and second insulators of said repeller assembly are geometrically configured such that these parts are self-aligning along a longitudinal main direction of extent of said repeller shaft when disposing said repeller and said tubular insert on the inner side of the arc chamber and said at first and second insulators on the outer side of the arc chamber, and when assembling them together through said opening in said wall of the arc chamber.

16. The arc chamber according to claim 13, wherein an outer gap is defined outside the arc chamber extending between the outer side of the arc chamber and said first insulator and then into said first insulator where it ends, wherein a width of said outer gap is ≤2 mm.

17. The arc chamber according to claim 16, further comprising a cup shaped shield such that said outer gap furthermore extends between the outer side of the arc chamber and said cup shaped shield, such that said outer gap generates a tortuous path containing at least three turns.

18. The arc chamber according to claim 17, wherein said outer gap has in addition a side branch extending between said first insulator and said cup-shaped shield and then between said second insulator and said cup-shaped shield where it ends.

* * * * *